United States Patent
Coolbaugh et al.

(10) Patent No.: US 7,098,521 B2
(45) Date of Patent: Aug. 29, 2006

(54) REDUCED GUARD RING IN SCHOTTKY BARRIER DIODE STRUCTURE

(75) Inventors: Douglas D. Coolbaugh, Essex Junction, VT (US); Ebenezer E. Eshun, Essex Junction, VT (US); Alvin J. Joseph, Williston, VT (US); Robert M. Rassel, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/711,744

(22) Filed: Oct. 1, 2004

(65) Prior Publication Data

US 2006/0071292 A1    Apr. 6, 2006

(51) Int. Cl.
*H01L 29/812* (2006.01)
(52) U.S. Cl. .................. 257/484; 257/480; 257/260
(58) Field of Classification Search .............. 257/109, 257/449, 471, 482, 484
See application file for complete search history.

(56) References Cited

U.S. PATENT DOCUMENTS

| | | | |
|---|---|---|---|
| 3,742,317 A | 6/1973 | Shao | 257/484 |
| 3,891,479 A | 6/1975 | Zwernemann | 438/495 |
| H0040 H * | 4/1986 | Buchanan et al. | 257/484 |
| 5,665,993 A * | 9/1997 | Keller et al. | 257/377 |
| 5,696,025 A | 12/1997 | Violette et al. | 438/570 |
| 6,066,884 A * | 5/2000 | Krutsick | 257/484 |
| 6,096,618 A | 8/2000 | Dunn et al. | 438/328 |
| 6,121,122 A | 9/2000 | Dunn et al. | 438/583 |
| 6,177,712 B1 | 1/2001 | Miyasaka | 257/484 |
| 6,303,969 B1 | 10/2001 | Tan | 257/484 |
| 6,580,141 B1 | 6/2003 | Hshieh et al. | 257/471 |

FOREIGN PATENT DOCUMENTS

| | | |
|---|---|---|
| JP | 63-115368 | 5/1988 |
| JP | 63-115369 | 5/1988 |
| JP | 2003-101036 | 4/2003 |

* cited by examiner

*Primary Examiner*—Thomas L. Dickey
(74) *Attorney, Agent, or Firm*—Richard M. Kotulak, Esq.; Greenblum & Bernstein, P.L.C.

(57) ABSTRACT

Schottky barrier diodes use a dielectric separation region to bound an active region. The dielectric separation region permits the elimination of a guard ring in at least one dimension. Further, using a dielectric separation region in an active portion of the integrated circuit device may reduce or eliminate parasitic capacitance by eliminating this guard ring.

16 Claims, 10 Drawing Sheets

REDUCED GUARD RING IN SCHOTTKY BARRIER DIODE STRUCTURE

FIELD OF THE INVENTION

The invention relates to Schottky barrier diodes and, more particularly, to Schottky barrier diodes using a dielectric separation region to bound an active Schottky junction area to reduce or eliminate parasitic capacitance caused by the use of a guard ring around an anode of an integrated circuit device.

BACKGROUND OF THE INVENTION

Schottky barrier diodes, such as in a rectifier, may involve using a p-type guard ring located at the periphery of the metal electrode. The guard ring may reduce or eliminate edge effects by reducing the electrical field concentrations and by moving the edge of the electrode away from the barrier junction. However, use of a guard ring introduces parasitic capacitance that often must be accounted for when designing a circuit.

In the past, Schottky diode devices have been used in an integrated circuit. A P+ guard ring has been used around the edge of the silicon active region and the isolation oxides. The P+ guard ring was used to improve the reliability of the integrated circuit. For example, a P+ guard ring was formed around the anode of the integrated circuit diode device. However, issues in performance may arise due to the P+ guard ring. More particularly, with a P+ guard ring, the P+ region may act as a landing pad for contacts to land on, and therefore may become part of the device and provide unwanted parasitic capacitance. When the device is used at high frequencies, the parasitic capacitance occurs from the P+ junction down to the sub-collector and plus regions; however, parasitic capacitance may also occur with an N+ junction down to the relevant sub-collector within a P-type Schottky diode structure.

FIGS. 1A, 1B and 1C illustrate top, first side and second side views, respectively, of a Schottky barrier diode (SBD) in a conventional embodiment. The SBD 100 includes cathodes 102 having cathode contacts 104, and an anode 106 having anode contacts 108. Reach-through implants 110 are located beneath the cathodes 104. A sub-collector 112 is located so as to be connected to both reach through implants 110 and serves as the actual devices cathode region. A guard ring 114 implant region is provided on the periphery of the anode 106 to reduce current leakage, improve reliability and eliminate current crowding. However, the guard ring 114 may introduce parasitic capacitance from its P+ region to the N+ sub-collector. Parasitic capacitance may be of particular issue at higher frequencies, e.g., frequencies greater than 50 GHz.

SUMMARY OF THE INVENTION

According to an exemplary embodiment of the invention, a Schottky barrier diode includes an active area, at least one separation region bounding the active area, and an electrode formed in the active area to form a Schottky junction, wherein the at least one separation region reduces parasitic capacitance about the Schottky junction.

According to a further exemplary embodiment of the invention, a Schottky barrier diode includes a semiconductor substrate, at least one separation region bounding an active area formed on the semiconductor substrate, a portion of a guard ring on the substrate, and an electrode formed on a surface of the semiconductor substrate in the active area to form a Schottky junction, wherein the at least one separation region reduces parasitic capacitance about the Schottky junction, and the separation region is substantially formed in the active region to eliminate other portions of the guard ring at the portion where the at least one separation region is located.

According to another exemplary embodiment of the invention, a process for forming a Schottky barrier diode, includes the steps of forming an active area in a substrate, forming an electrode on the substrate in the active area to form a Schottky junction, and forming at least one separation region on the substrate where the at least one separation region is bounded on one side by the active area, wherein the at least one separation region reduces parasitic capacitance about the Schottky junction.

BRIEF DESCRIPTION OF THE DRAWINGS

The above and other features and advantages of the invention will become more apparent to those of ordinary skill in the art by describing in detail exemplary embodiments thereof with reference to the attached drawings in which.

DETAILED DESCRIPTION OF EMBODIMENTS OF THE INVENTION

The invention relates to Schottky barrier diodes using a dielectric separation region to bound an active region, which thus eliminates at least a portion of a guard ring in at least one dimension. As described hereinafter, a guard ring is referred to as a non-closed loop landing pad of a p-type (or n-type) region. Thus, the guard ring is disjointed, in that it is not a connected or closed ring. The guard ring will be used to reduce current leakage, improve reliability, eliminate current crowding and act as a landing pad region for contacts. Although the present invention is directed to eliminating a portion of such a guard ring, the use of the term guard ring will continue to be used to indicate a structure for performing such functions, even when the structure is not in the shape of a ring. According to an embodiment of the invention, the use of a P+ guard ring may be reduced or eliminated by employing the separation region. This may allow the reduction or elimination of parasitic capacitance in the integrated circuit device. The separation region, which may be a dielectric, may be formed in an active region of the SBD. This separation region eliminates regions of the guard ring in one or two dimensions.

Figure 1A:
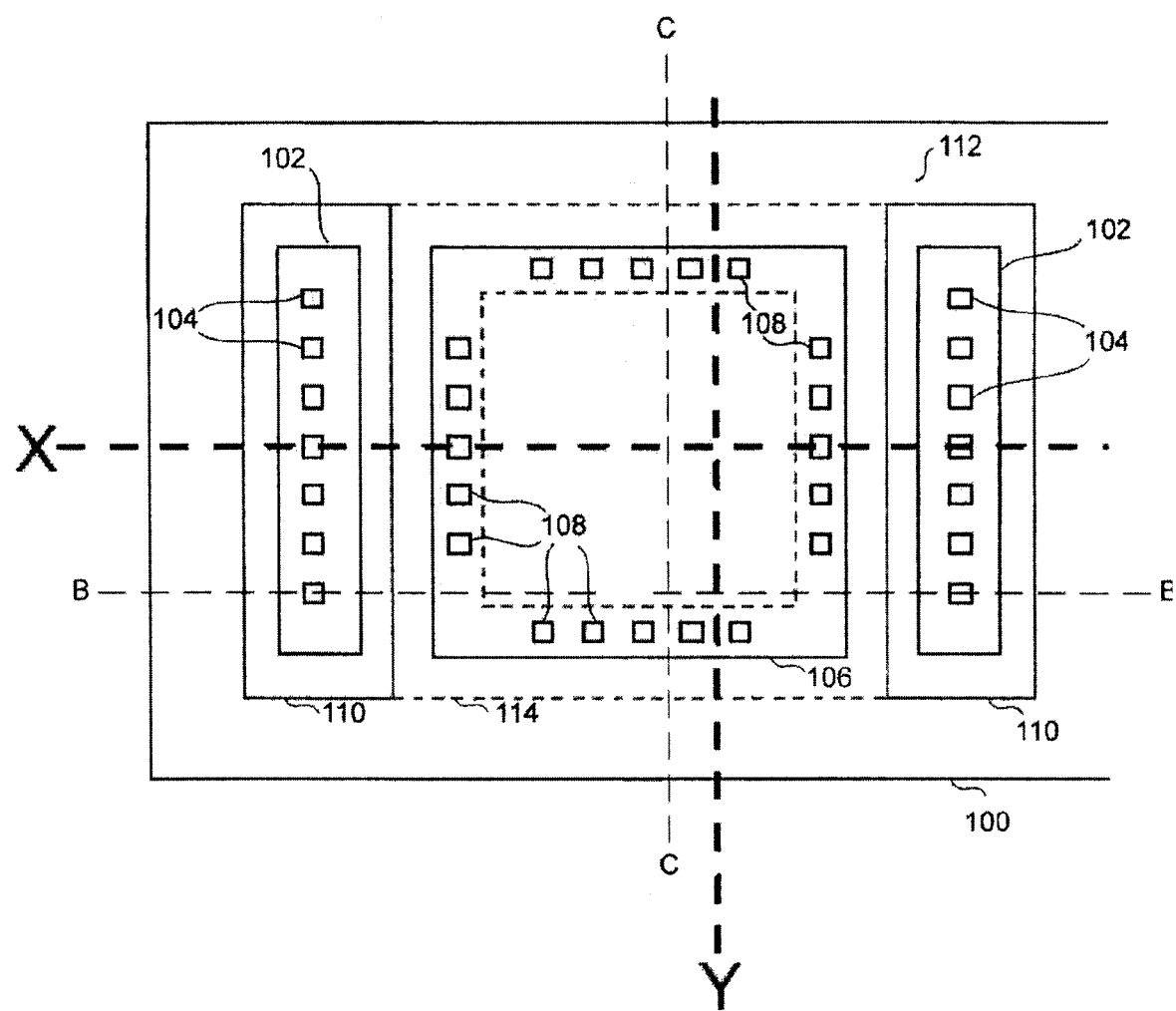
FIGS. 1A, 1B and 1C illustrate top, first side and second side views, respectively, of a Schottky barrier diode in a conventional embodiment.
Figure 1B:
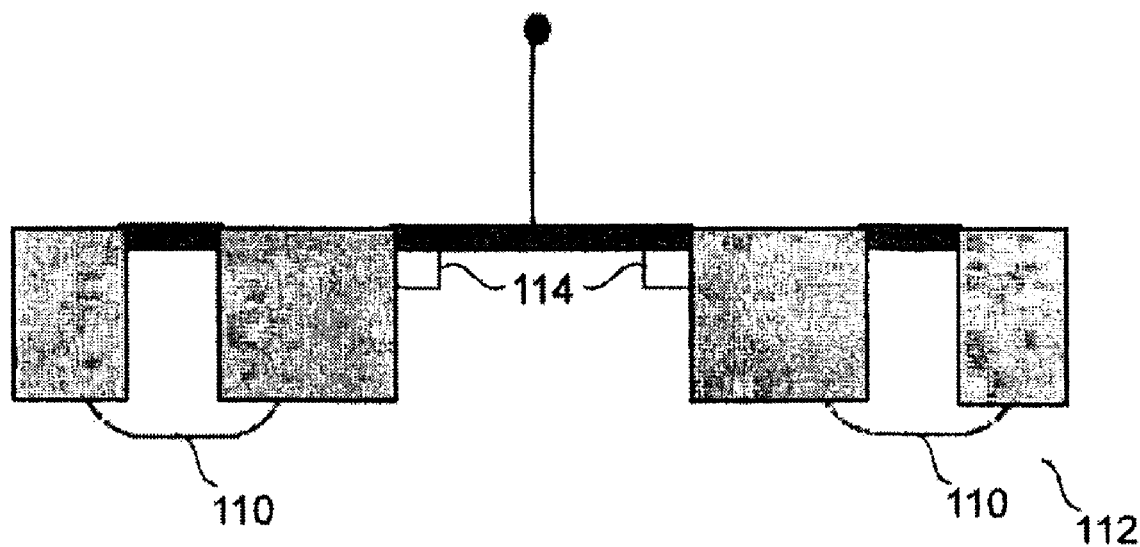
Figure 1C:
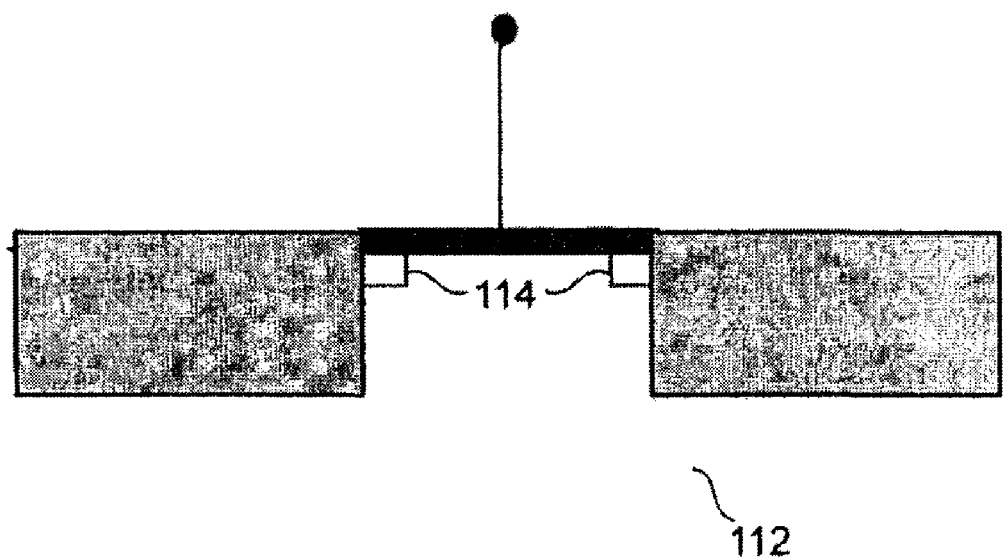
Figure 2A:
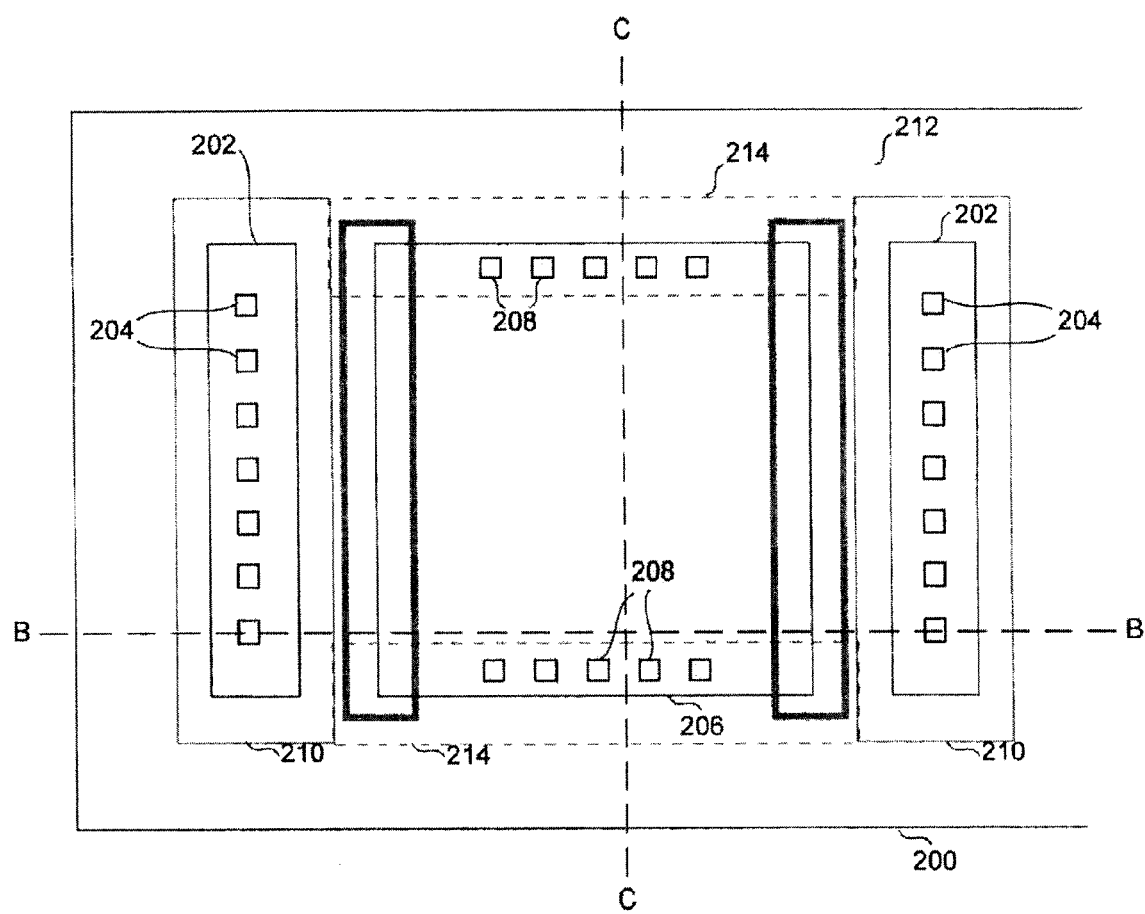
FIG. 2A illustrates a top view of a Schottky barrier diode structure according to an embodiment of the invention.

FIG. 2A illustrates a top view of a Schottky barrier diode structures according to an embodiment of the invention. The SBD 200 includes cathodes 202 having cathode contacts 204, and an anode 206 having anode contacts 208. Reach through implants 210 are located beneath the cathodes 204. A sub-collector 212 is located so as to be connected to both reach through implants 210. A portion of guard ring 214 is provided between a portion of the cathodes 202 and the anode 206. However, a separation region 216 is provided to replace other portions of guard ring 214 in one dimension.

Separation region 216 may be an insulator to reduce current leakage, improve reliability and eliminate current crowding, as well as reduce or eliminate parasitic capacitance. Thus, the P+ parasitic capacitance may be reduced or eliminated in the x-direction. In one embodiment of the invention, separation region 216 is provided in one dimension, thereby replacing that portion of the guard ring 214. Thus, the guard ring is disjointed, in that it is not a connected or closed ring.

Figure 2B:
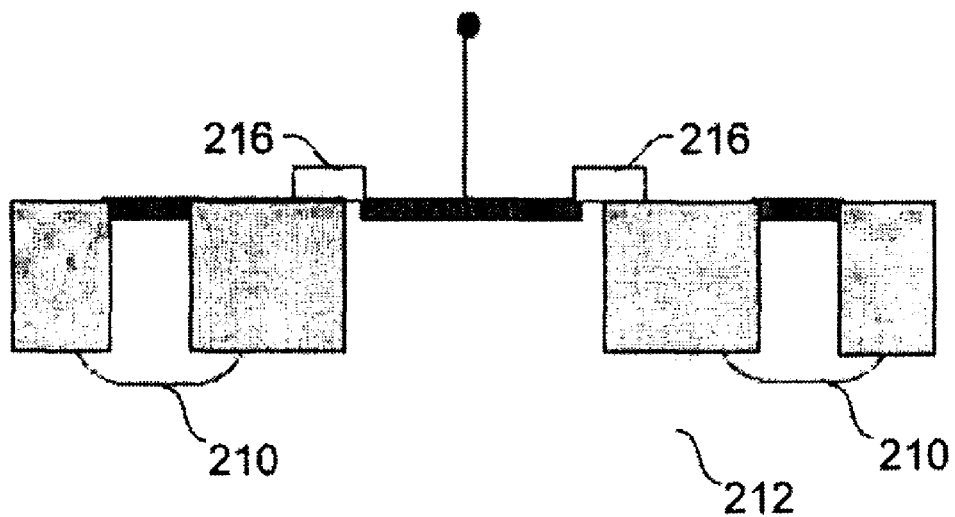
FIG. 2B illustrates a side view of an embodiment of the invention along line B—B in FIG. 2A.

FIG. 2B illustrates a side view of an embodiment of the invention along line B—B in FIG. 2A. Separation region 216 is shown in one dimension. Reach through implants 210 are adjacent to the sub-collector 212. Sub-collector 212 is located generally below separation region 216.

Figure 2C:
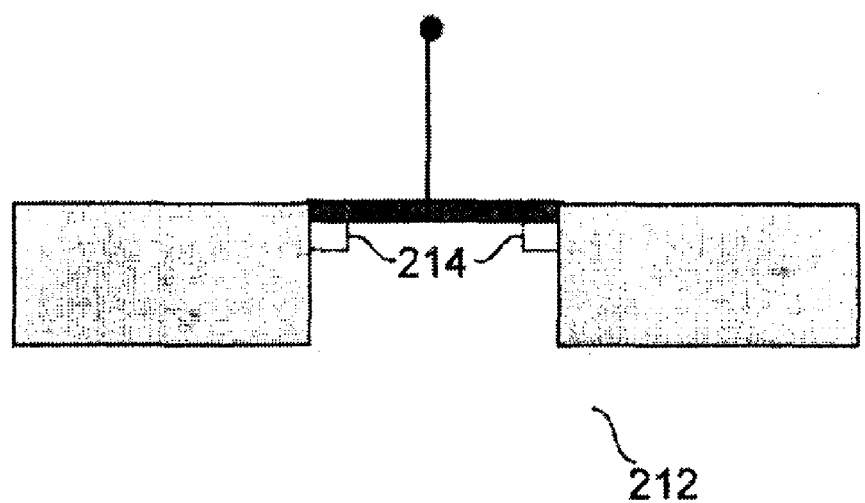
FIG. 2C illustrates a side view of an embodiment of the invention along line C—C in FIG. 2A.

FIG. 2C illustrates a side view of an embodiment of the invention along line C—C in FIG. 2A. A portion of guard ring 214 is shown in one dimension. Sub-collector 212 is located generally below guard ring 214.

Figure 3A:
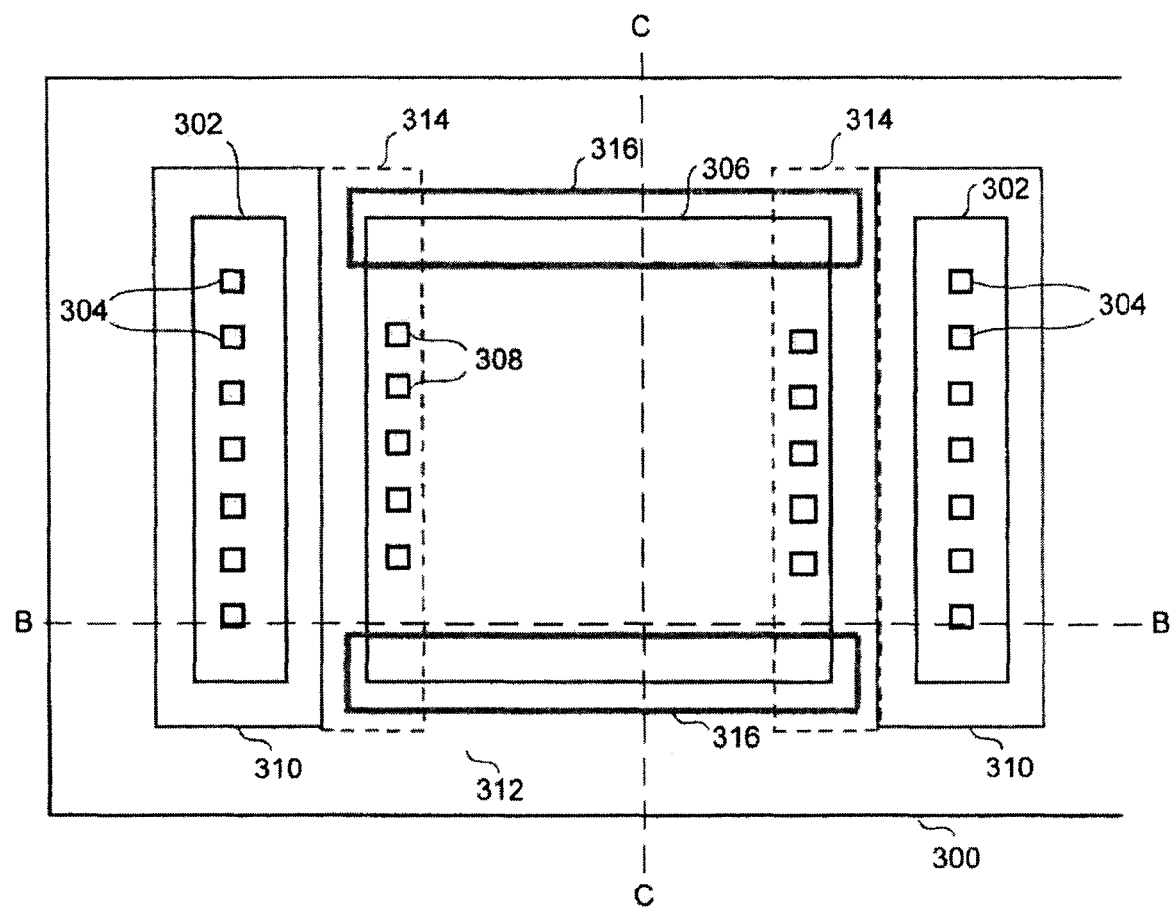
FIG. 3A, illustrates a top view of a Schottky barrier diode structure according to an embodiment of the invention.

FIG. 3A illustrates a top view of a Schottky barrier diode structure according to an embodiment of the invention. The SBD 300 includes cathodes 302 having cathode contacts 304, and an anode 306 having anode contacts 308. Reach through implants 310 are located beneath the cathodes 304. A sub-collector 312 is located so as to be connected to both reach through implants 310. A portion of a guard ring 314 is provided between the cathodes 302 and the anode 306. However, separation region 316 is provided to replace a portion of guard ring 314 in one dimension. Thus, the P+ parasitic capacitance may be reduced or eliminated in the y-direction. In one embodiment of the invention, separation region 316 is provided in one dimension, thereby replacing that portion of the implanted guard ring 314. Thus, the guard ring is disjointed, in that it is not a connected or closed ring.

Figure 3B:
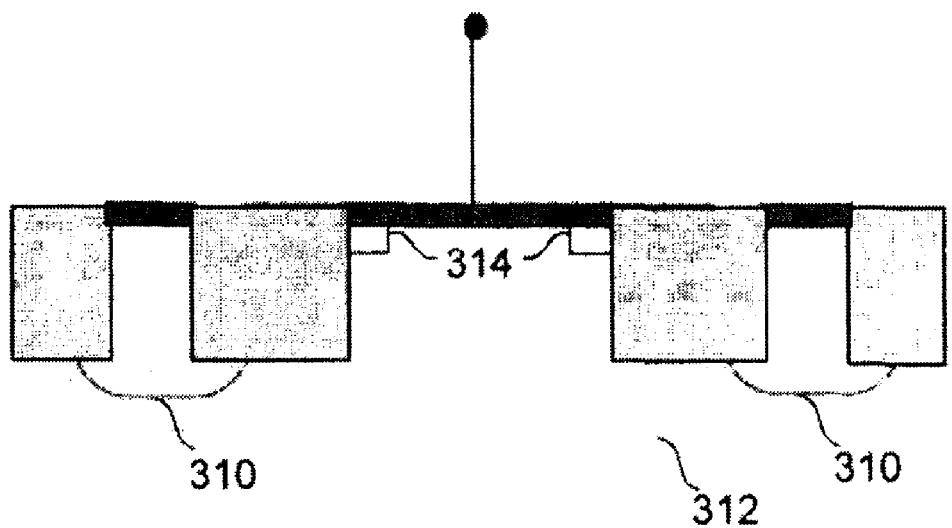
FIG. 3B illustrates a side view of an embodiment of the invention along line B—B of FIG. 3A.

FIG. 3B illustrates a side view of an embodiment of the invention along line B—B in FIG. 3A. Reach through implants 310 are adjacent to the sub-collector 312. A portion of guard ring 314 is shown in one dimension. Sub-collector 312 is located generally below guard ring 314.

Figure 3C:
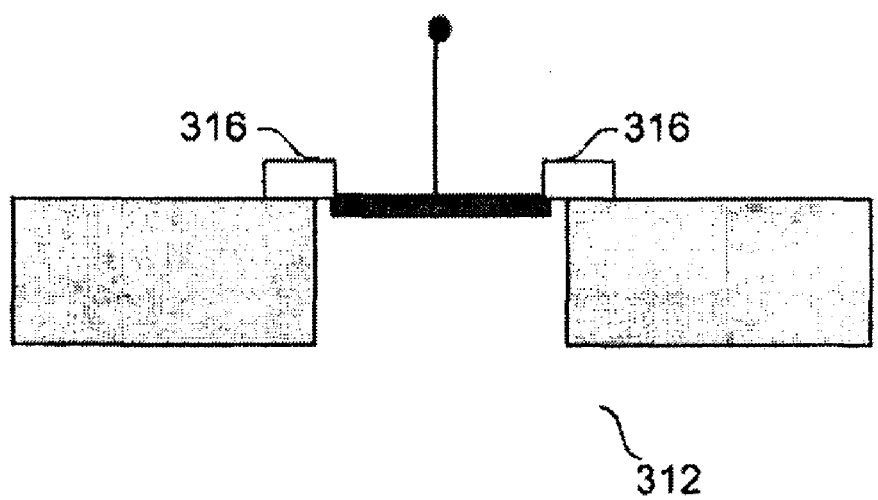
FIG. 3C illustrates a side view of an embodiment of the invention along line C—C in FIG. 3A.

FIG. 3C illustrates a side view of an embodiment of the invention along line C—C in FIG. 3A. Separation region 316 is shown in one dimension. Sub-collector 312 is located generally below separation region 316.

According to an embodiment of the invention, parasitic capacitance from the guard ring may be reduced or eliminated by using a nitride thin film layer in the separation region 216, 316 in the standard CMOS or standard integrated circuit device technology. For example, a nitride, an oxide, a polymer and/or a glass material may be used to build a resistor or other insulating non-conductive structure.

According to an exemplary embodiment of the invention, the separation region 216, 316 is a dielectric, such as that used for resistors, placed at the end of the front end of line (FEOL) process of the integrated circuit to block the silicide formation on the silicon in that region. In this manner, a nitride layer placed in this position in a diode integrated circuit device moves the Schottky junction away from that edge, thereby allowing a portion of the guard ring to be eliminated.

Once the separation region 216, 316, such as a nitride layer, is placed down, the integrated circuit device is etched using any conventional etching process. A standard silicidation process is performed, so that the silicide is formed everywhere that the silicon is exposed and not formed under the nitride layer. By using the nitride layer, the P+ guard ring may be eliminated in at least one dimension in such areas.

Thus, the nitride layer may be used to prevent the metallurgical junction from being formed all the way to the edge of the diode device, thereby enabling the elimination of at least a portion of the P+ guard ring.

Accordingly, in embodiments of the invention, a portion of the guard ring is maintained at least in a portion of the integrated circuit device to act as a landing pad region for the contacts connected to the anode of the Schottky barrier diode device. As shown in FIGS. 2A–2C and 3A–3C, the separation layer or region 216, 316 eliminates other portions of the guard ring in one dimension. Also, according to another embodiment of the invention, a guard ring may be completely omitted from the SBD (which can be represented by any FIGS. 2A–4C). In such an embodiment, the separation layer or region is formed in two dimensions.

As shown in the figures and now understood in view of the disclosures, the device is a Schottky diode with a Schottky junction. The location of the Schottky junction is based in part on the configuration of the diode structure, the materials used, and the like. Based on the configurations described in various embodiments of the invention, the separation region reduces parasitic capacitance about the Schottky junction. Further, the edge of the Schottky junction may be spaced away from the isolation region bounding the active Si area.

Figure 4A:
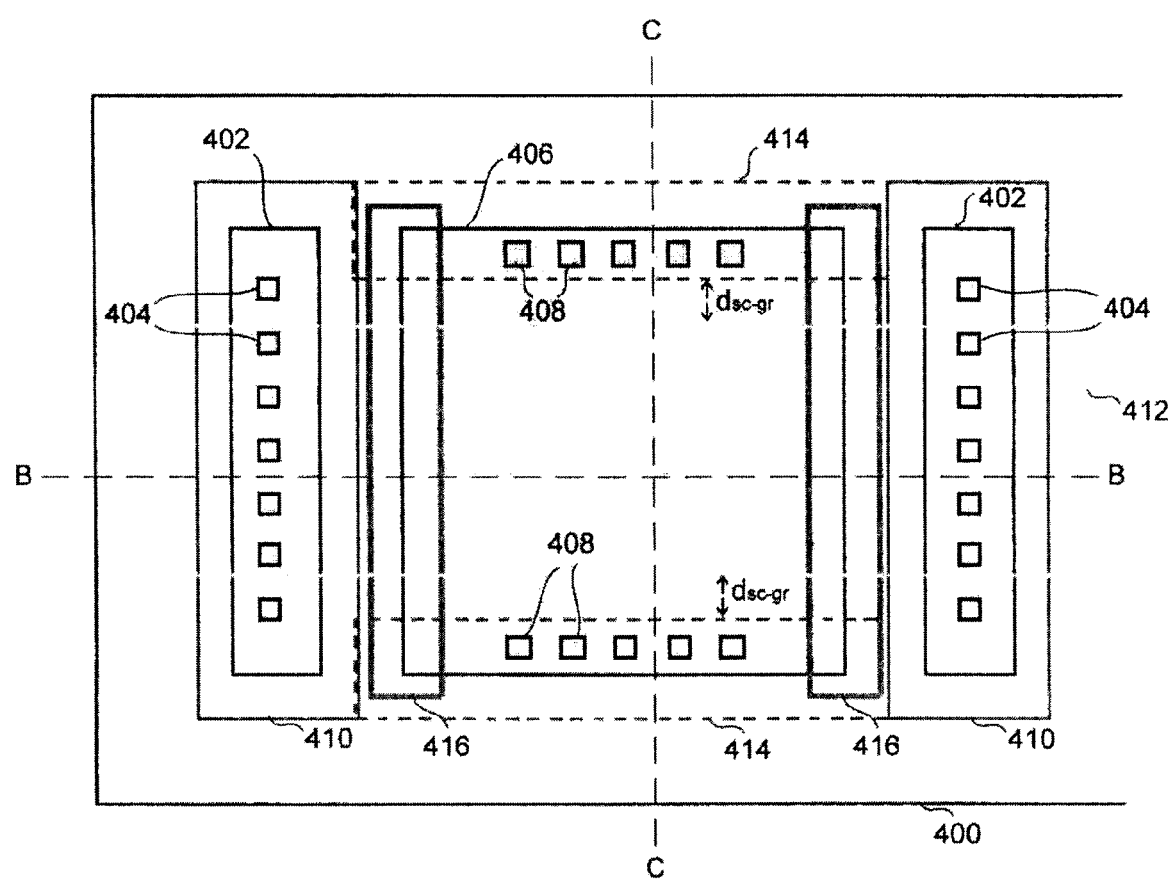
FIG. 4A illustrates a top view of a Schottky barrier diode structure according to an embodiment of the invention.
Figure 4B:
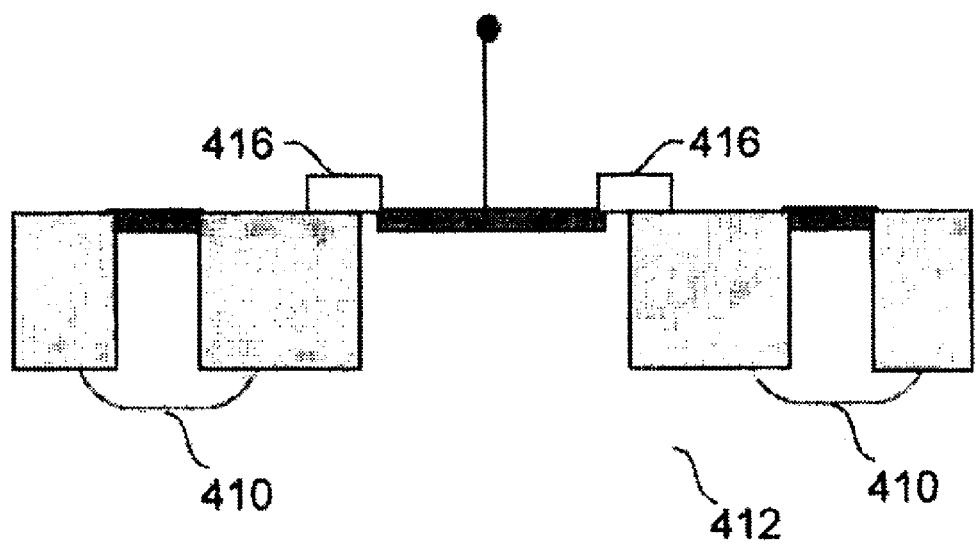
FIG. 4B illustrates a side view of an embodiment of the invention along line B—B of FIG. 4A.
Figure 4C:
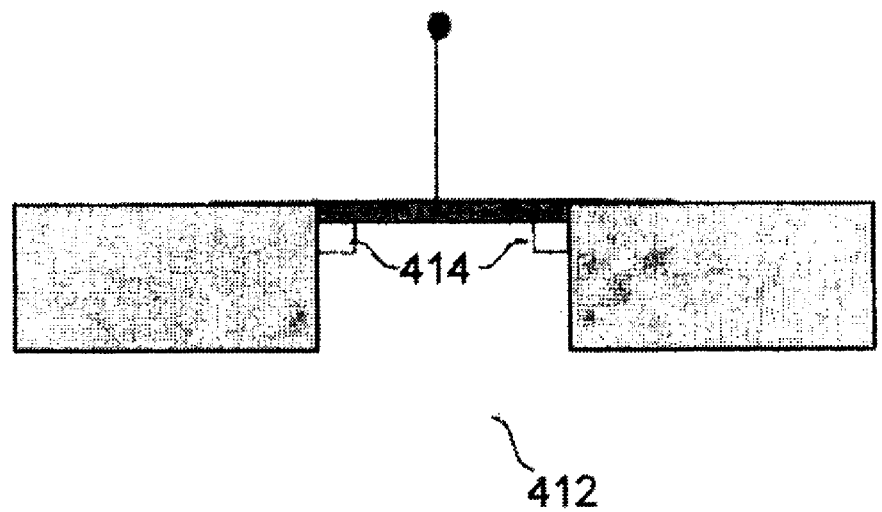
FIG. 4C illustrates a side view of an embodiment of the invention along line C—C of FIG. 4A.

FIGS. 4A–4C illustrate an embodiment with the P+ guard ring located away from the active part of the device. Therefore, the device may include a portion of the guard ring while reducing or eliminating parasitic capacitance from the P+ to the N+ region. Distance $d_{sc\text{-}gr}$ is the distance between the sub-collector region and the guard ring. The distance $d_{sc\text{-}gr}$ may be varied to control, reduce or eliminate the parasitic capacitance in the device. According to an embodiment of the invention, the distance $d_{sc\text{-}gr}$ may be far enough to reduce the parasitic capacitance but close enough to allow the guard ring to cover the contacts. This distance may vary based on, among other criteria, the type of sub-collector used, the integrated circuit device, the materials, the doping levels, and the like.

In particular, FIG. 4A illustrates a top view of a Schottky barrier diode structure according to an embodiment of the invention. The SBD 400 includes cathodes 402 having cathode contacts 404, and an anode 406 having anode contacts 408. Reach through implants 410 are located beneath the cathodes 404. A sub-collector 412 is located so as to be connected to both reach through implants 410. A portion of a guard ring 414 is provided between the cathodes 402 and the anode 406.

In this embodiment, separation region 416 is provided to isolate the anode 406 Schottky junction from the isolation or shallow trench isolation edge. In one embodiment of the invention, separation region 416 is provided in one dimension, thereby replacing that portion of the guard ring 414. Thus, the guard ring 414 is disjointed, in that it is not a connected or closed ring. Thus, the P+ capacitance may be reduced or eliminated by the separation region 416 in the x-direction, while the P+ capacitance may be reduced based on distance $d_{sc-gr}$, discussed below, in the y-direction.

FIG. 4B illustrates a side view of an embodiment of the invention along line B—B in FIG. 4A. Separation region 416 is shown in one dimension. Reach through implants 410 are adjacent to the sub-collector 412. Sub-collector 412 is located generally below separation region 416.

FIG. 4C illustrates a side view of an embodiment of the invention along line C—C in FIG. 4A. A portion of guard ring 414 is shown in one dimension. Sub-collector 412 is located generally below guard ring 414.

The sub-collector 412 may be implanted in devices used for various technologies, such as wireless devices. The deep implanted sub-collector process may result in less lateral diffusion of the dopant, so a sub-collector defined within the guard rings does not diffuse as much laterally as compared to a buried subcollector process. A buried sub-collector process may include implanting the sub-collector, growing a film on top, burying the sub-collector, and annealing the film. The profile of such sub-collector may be such that the dopant concentration is highest in the active region of the device, and gradually lowers so the concentration can be lower underneath at the contact and thus reduce guard ring to subcollector parasitic capacitance.

Figure 5:
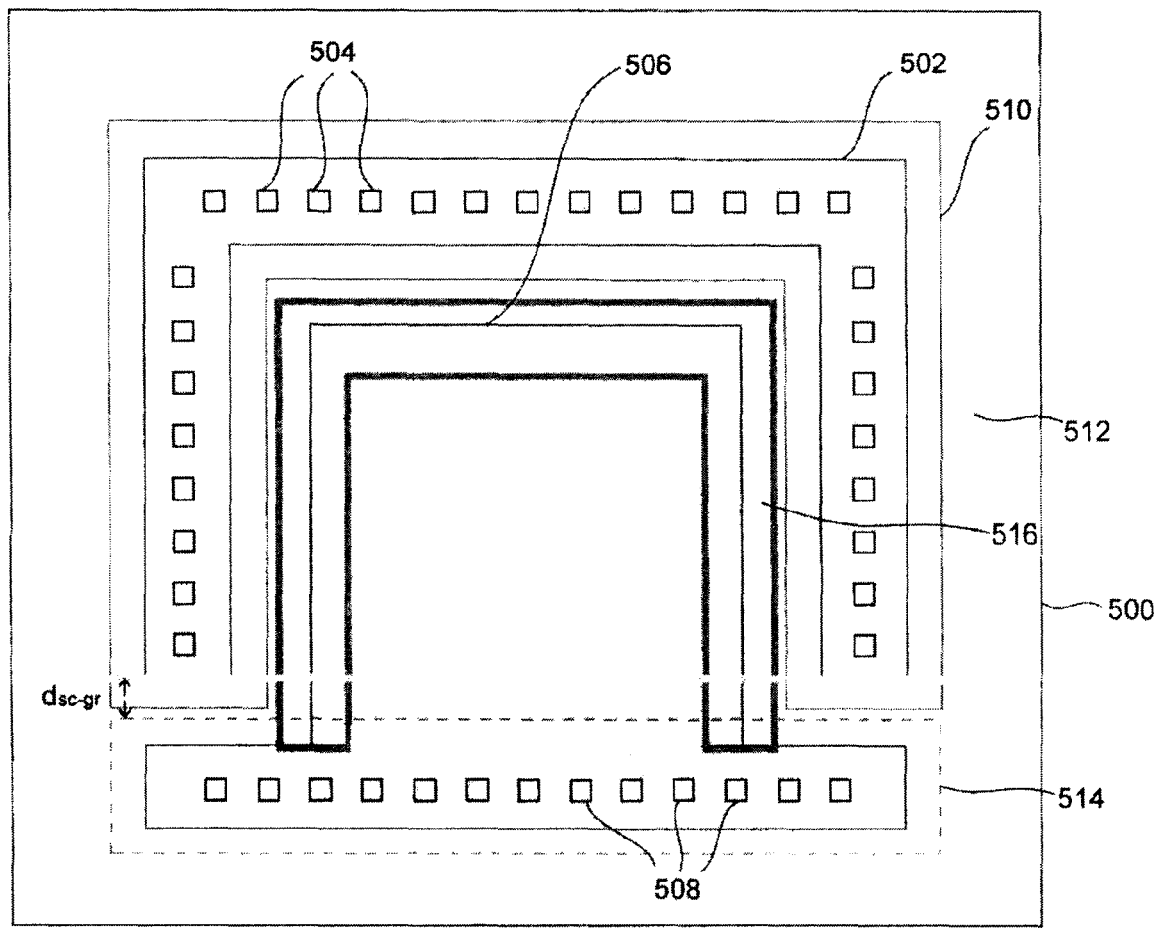
FIG. 5 illustrates a top view of a Schottky barrier diode structure according to an embodiment of the invention.

FIG. 5 illustrates a top view of a Schottky barrier diode structure according to an embodiment of the invention. The SBD 500 includes a cathode 502 having cathode contacts 504, and an anode 506 having anode contacts 508. Reach through implant 510 is located beneath the cathodes 504. A sub-collector 512 is located so as to be connected to the reach through implant 510. A portion of a guard ring 514 is provided on one side of the anode 506.

In this embodiment, separation region 516 is provided to isolate the anodes 506 Schottky junction from the isolation or STI region edge around this active Si region. In one embodiment of the invention, separation region 516 is provided on three sides of the anode 506, thereby replacing those portions of the guard ring 514. Thus, the guard ring 514 is one strip or side, while the separation region 516 is formed in a "U" shape. Thus, the parasitic capacitance may be reduced or eliminated by the separation region 516 in both the x-direction and the y-direction, while the parasitic capacitance may be reduced based on distance $d_{sc-gr}$, discussed above, in the y-direction. The SBD of FIG. 5 operates in a similar manner to those illustrated in FIGS. 2–4.

Figure 6:
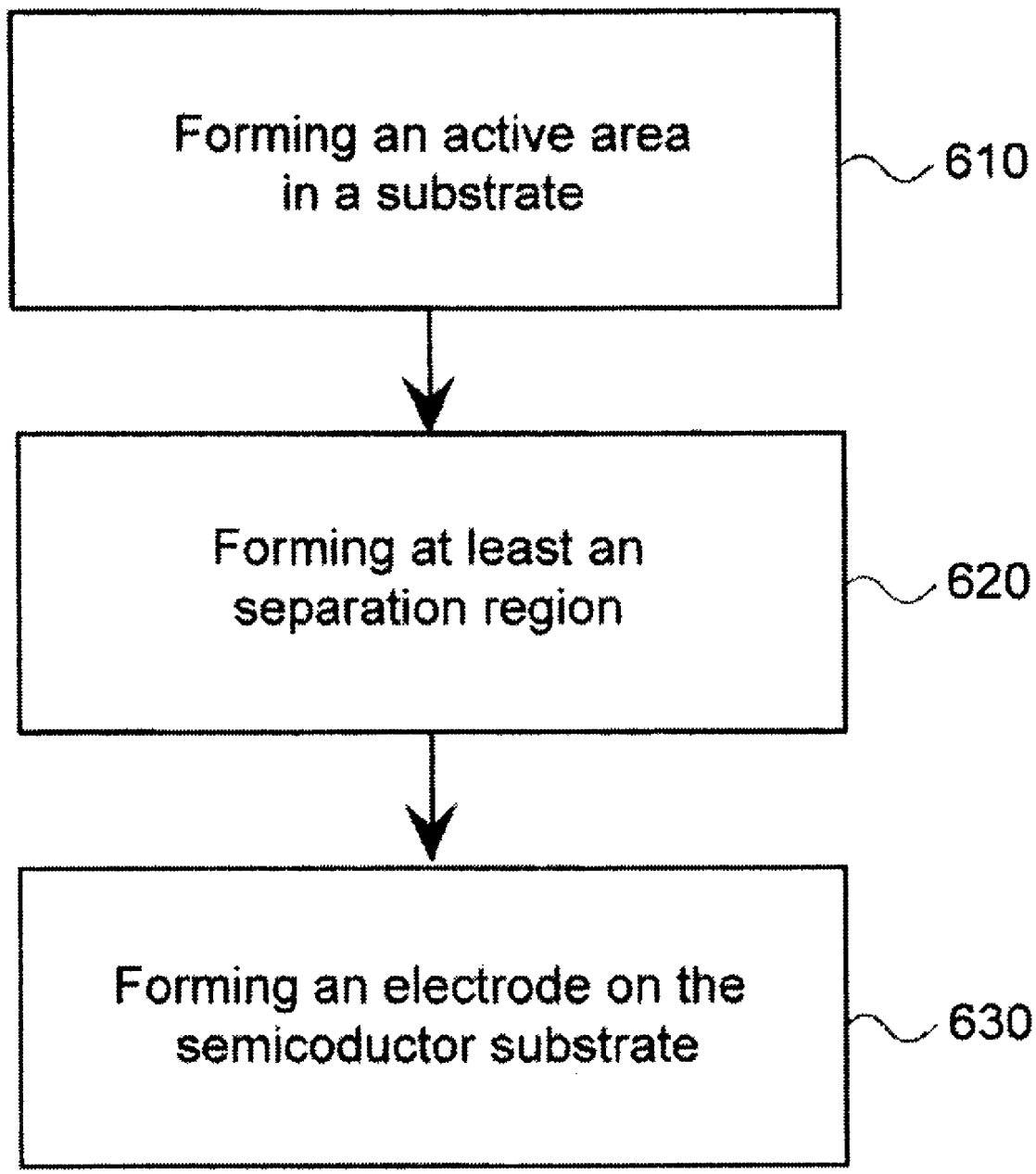
FIG. 6 is a flowchart illustrating a method of making a Schottky barrier diode structure according to an embodiment of the invention.

FIG. 6 is a flowchart illustrating a method of making Schottky barrier diode structures according to an embodiment of the invention. At step 610, an active region is formed in a substrate. With reference to FIG. 4A for illustration, an active region may be a cathode 402 and/or an anode 406 formed in any conventionally known manner.

At step 620, an separation region is formed. As described above, forming the separation region may include placing a dielectric layer, such as nitride, glass, polymer, oxide, or similar material, on the substrate. This may be performed by using any known deposition or appropriate growing method and, if necessary, a planarization step. A silicidation process is then performed on the substrate to provide silicide. The dielectric layer blocks the silicide formation on the substrate, such that the dielectric forms the separation region and reduces or eliminates parasitic capacitance in the integrated circuit device.

At step 630, one or more electrodes are formed in any known manner on the surface of the substrate. This formation completes the Schottky diode, where parasitic capacitance is reduced or eliminated in the resulting integrated circuit device.

While the invention has been described in terms of exemplary embodiments, those skilled in the art will recognize that the invention can be practiced with modifications and in the spirit and scope of the appended claims.

What is claimed is:

1. A Schottky barrier diode, comprising:
   an active area;
   a guard ring that is one of disjointed, a non-closed loop, and missing a portion in at least one dimension;
   at least one separation region bounding the active area; and
   an electrode formed in the active area to form a Schottky junction, wherein the at least one separation region reduces parasitic capacitance about the Schottky junction.

2. The Schottky barrier diode according to claim 1, wherein the electrode comprises a suicide.

3. The Schottky barrier diode according to claim 1, wherein the at least one separation region is a dielectric material selected from a group consisting of an oxide, a polymer, a glass, and a nitride.

4. The Schottky barrier diode according to claim 1, wherein the portion of the guard ring is removed from about the active area.

5. The Schottky barrier diode according to claim 1, wherein the at least one separation region bounds the active area in one dimension.

6. The Schottky barrier diode according to claim 1, wherein the at least one separation region comprises a plurality of separation regions, and where the plurality of separation regions bound the active area in two dimensions.

7. The Schottky barrier diode according to claim 1, wherein the at least one separation region partially surrounds the active region.

8. The Schottky barrier diode according to claim 1, wherein the Schottky junction has edges spaced away from the at least one separation region bounding the active area.

9. A process for forming a Schottky barrier diode, comprising the steps of:
   forming an active area in a substrate;
   forming an electrode on the substrate in the active area to form a Schottky junction;
   forming a guard ring that is one of disjointed, a non-closed ring, and missing a portion in at least one dimension; and
   forming at least one separation region on the substrate where the at least one separation region is bounded on one side by the active area, wherein the at least one separation region reduces parasitic capacitance about the Schottky junction.

10. The method according to claim 9, wherein the electrode is formed with a silicide.

11. The method according to claim 9, wherein the at least one separation region is formed with a dielectric material selected from a group consisting of an oxide, a polymer, a glass, and a nitride.

12. The method according to claim 9, wherein the at least one separation region is formed to bound the active area of the Schottky junction in one dimension.

13. The method according to claim 9, wherein forming the at least one separation region comprises forming a plurality of separation regions and the plurality of separation regions bound the active area of the Schottky junction in two dimensions.

14. The method according to claim 9, wherein the Schottky junction is formed to have edges spaced away the at least one separation region bounding the active area.

15. The method according to claim 9, wherein the at least one separation region comprises two spaced apart separation regions.

16. The method according to claim 9, wherein the at least one separation region comprises a U-shaped separation region.

* * * * *